United States Patent
Berg et al.

(10) Patent No.: US 10,996,239 B1
(45) Date of Patent: May 4, 2021

(54) METHOD OF POSITIONING PROBE TIPS RELATIVE TO PADS

(71) Applicant: MPI Corporation, Hsinchu County (TW)

(72) Inventors: Ingo Berg, Hsinchu County (TW); Chien-Hung Chen, Hsinchu County (TW); Frank Fehrmann, Hsinchu County (TW); Sebastian Giessmann, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 0 days.

(21) Appl. No.: 16/872,390

(22) Filed: May 12, 2020

(51) Int. Cl.
*G01Q 20/02* (2010.01)
*G01Q 70/06* (2010.01)

(52) U.S. Cl.
CPC .............. *G01Q 20/02* (2013.01); *G01Q 70/06* (2013.01)

(58) Field of Classification Search
CPC ........ G01Q 10/00; G01Q 10/02; G01Q 10/04; G01Q 20/00; G01Q 20/02; G01Q 70/00; G01Q 70/02; G01Q 70/06; G01Q 70/08
USPC ................... 850/1, 2, 3, 5, 6, 52, 53, 55, 56
See application file for complete search history.

(56) References Cited

U.S. PATENT DOCUMENTS

| | | | | |
|---|---|---|---|---|
| 7,526,949 B1* | 5/2009 | Liu | ........................ | G01Q 70/10 73/105 |
| 2008/0315092 A1* | 12/2008 | Kley | ....................... | C23C 16/52 250/307 |
| 2015/0285836 A1* | 10/2015 | Humphris | .............. | G01Q 10/00 850/1 |
| 2016/0231351 A1* | 8/2016 | Lee | ........................ | G01Q 70/06 |

* cited by examiner

*Primary Examiner* — Nicole M Ippolito
(74) *Attorney, Agent, or Firm* — CKC & Partners Co., LLC

(57) ABSTRACT

A method of positioning probe tips relative to pads includes: focusing on each of the probe tips in a first image as viewed by a microscope and collecting the coordinates of the corresponding probe tip relative to a first reference point in the first image; focusing on each of the pads in a second image as viewed by the microscope and collecting the coordinates of the corresponding pad relative to a second reference point in the second image, a relative position of the second reference point to the first reference point being predetermined; matching the pads with the probe tips when the quantity of the probe tips and the pads are equal while minimizing a maximum value of the distances calculated between each of the probe tips and the corresponding pad; and moving the probe tips to touch the pads with the maximum value minimized.

15 Claims, 10 Drawing Sheets

METHOD OF POSITIONING PROBE TIPS RELATIVE TO PADS

BACKGROUND

Technical Field

The present disclosure relates to methods of positioning probe tips relative to pads. More particularly, the present disclosure relates to pads disposed on wafers held by wafer probe stations.

Description of Related Art

As the demand for electronic devices has been increasing nowadays, the quality of the components of the electronic devices correspondingly becomes an important issue of the semiconductor industry. Apart from the improving technology of manufacture for the components, the accuracy of testing for the components has also become more important.

For example, wafer probe stations are in general used to test the quality of the wafers or dies in the semiconductor industry. Hence, the operational accuracy of wafer probe stations is undoubtedly concerned.

SUMMARY

A technical aspect of the present disclosure is to provide a method of positioning probe tips relative to pads, which can allow a multiple of probe tips to contact with a multiple of pads conveniently and precisely, thus effectively enhancing the performance of the wafer probe station.

According to an embodiment of the present disclosure, a method of positioning a plurality of probe tips relative to a plurality of pads is provided. The positioning method includes: focusing on each of the probe tips in a first image as viewed by a microscope along a direction and collecting a plurality of coordinates of the corresponding probe tip relative to a first reference point in the first image; focusing on each of the pads in a second image as viewed by the microscope along the direction and collecting a plurality of coordinates of the corresponding pad relative to a second reference point in the second image, a relative position of the second reference point to the first reference point being predetermined; comparing a quantity of the probe tips in the first image and a quantity of the pads in the second image; matching the pads with the probe tips when the quantity of the probe tips and the quantity of the pads are equal while minimizing a first maximum value of a plurality of first distances calculated between each of the probe tips and the corresponding pad; and moving the probe tips to touch the pads with the first maximum value minimized.

In one or more embodiments of the present disclosure, the positioning method further includes assigning one of the pads to match with the corresponding probe tip when the quantity of the probe tips and the quantity of the pads are unequal while minimizing a second maximum value of a plurality of second distances calculated between each of the probe tips to be matched and the corresponding pad to be matched.

In one or more embodiments of the present disclosure, the positioning method further includes stopping matching the pads with the probe tips when the quantity of the probe tips and the quantity of the pads are unequal.

In one or more embodiments of the present disclosure, the positioning method further includes offsetting the probe tips by an overtravel distance before the probe tips touching the pads such that the minimized first maximum value is maintained after the probe tips touch the pads by sliding the probe tips on the pads by the overtravel distance.

In one or more embodiments of the present disclosure, the step of matching the pads with the probe tips includes manually instructing to match the pads with the probe tips.

In one or more embodiments of the present disclosure, the coordinates of the probe tips and the coordinates of the pads are respectively three-dimensional coordinates.

According to another embodiment of the present disclosure, a method of positioning a plurality of probe tips relative to a plurality of pads disposed on a chuck is provided. The positioning method includes: focusing on each of the probe tips in a first image as viewed by a first microscope along a first direction and collecting a plurality of coordinates of the corresponding probe tip relative to a first reference point in the first image; focusing on each of the pads in a second image as viewed by a second microscope along a second direction and collecting a plurality of coordinates of the corresponding pad relative to a second reference point in the second image, the second direction being opposite to the first direction, a relative position of the second reference point to the first reference point being predetermined; comparing a quantity of the probe tips in the first image and a quantity of the pads in the second image; matching the pads with the probe tips when the quantity of the probe tips and the quantity of the pads are equal while minimizing a first maximum value of a plurality of first distances calculated between each of the probe tips and the corresponding pad; and moving the probe tips to touch the pads with the first maximum value minimized.

In one or more embodiments of the present disclosure, the first microscope is connected with the chuck.

In one or more embodiments of the present disclosure, the step of being viewed by the second microscope includes moving the chuck relative to the second microscope such that the pads disposed on the chuck are viewed by the second microscope.

In one or more embodiments of the present disclosure, the step of being viewed by the second microscope includes moving the chuck together with the second microscope relative to the probe tips such that the pads disposed on the chuck are viewed by the second microscope.

In one or more embodiments of the present disclosure, the positioning method further includes assigning one of the pads to match with the corresponding probe tip when the quantity of the probe tips and the quantity of the pads are unequal while minimizing a second maximum value of a plurality of second distances calculated between each of the probe tips to be matched and the corresponding pad to be matched.

In one or more embodiments of the present disclosure, the positioning method further includes stopping matching the pads with the probe tips when the quantity of the probe tips and the quantity of the pads are unequal.

In one or more embodiments of the present disclosure, the positioning method further includes offsetting the probe tips by an overtravel distance before the probe tips touching the pads such that the minimized first maximum value is maintained after the probe tips touch the pads by sliding the probe tips on the pads by the overtravel distance.

In one or more embodiments of the present disclosure, the step of matching the pads with the probe tips includes manually instructing to match the pads with the probe tips.

In one or more embodiments of the present disclosure, the coordinates of the probe tips and the coordinates of the pads are respectively three-dimensional coordinates.

When compared with the prior art, the above-mentioned embodiments of the present disclosure have at least the following advantage: the method of positioning a plurality of probe tips relative to a plurality of pads allows a multiple of probe tips to contact with a multiple of pads conveniently and precisely, thus effectively enhancing the performance of the wafer probe station.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
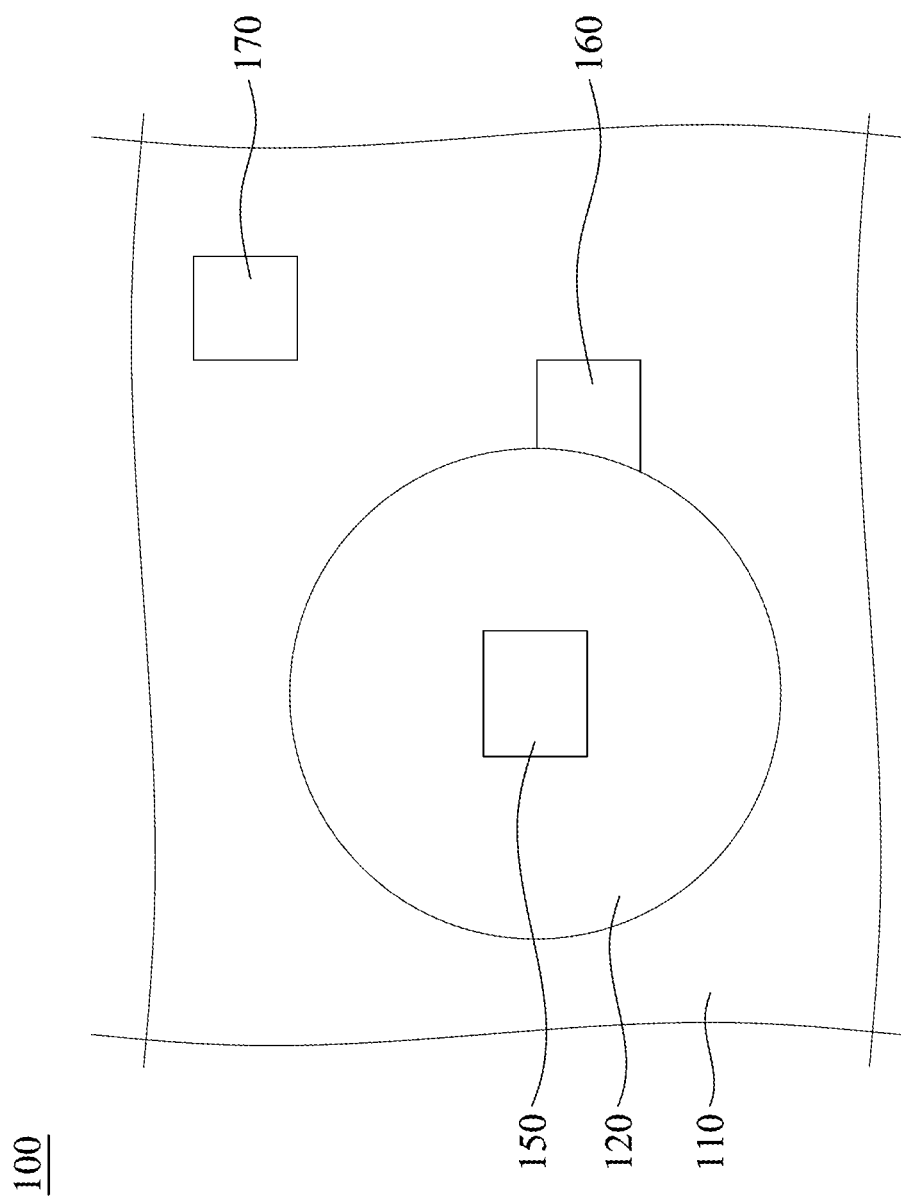
FIG. 1 is a top view of a wafer probe station according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
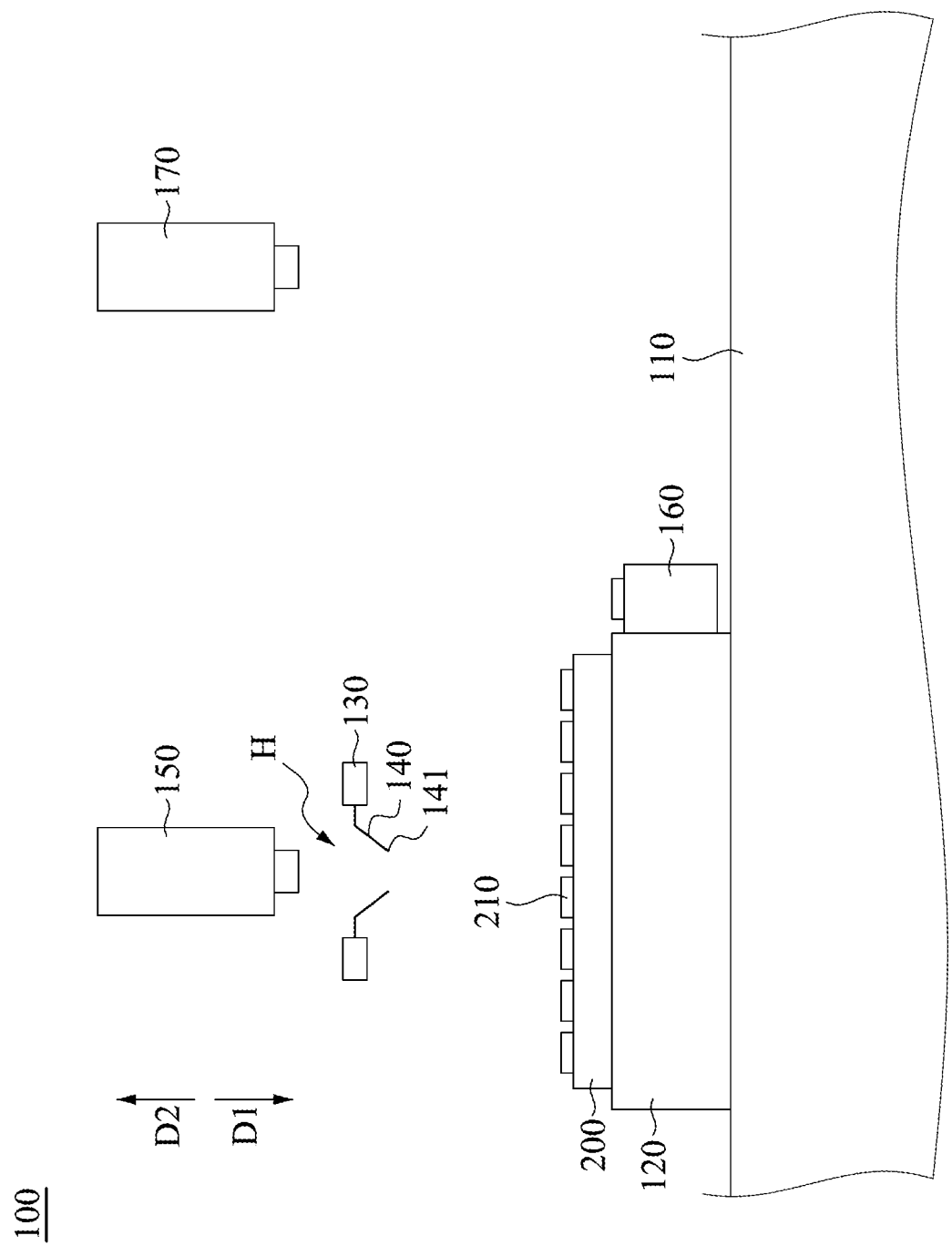
FIG. 2 is a front view of the wafer probe station of FIG. 1.

Reference is made to FIGS. 1-2. FIG. 1 is a top view of a wafer probe station according to an embodiment of the present disclosure. FIG. 2 is a front view of the wafer probe station of FIG. 1. In this embodiment, as shown in FIGS. 1-2, a wafer probe station 100 includes a stage 110, a chuck 120, a probe card 130, a plurality of probes 140, a first microscope 150, a second microscope 160 and a third microscope 170. The chuck 120 is mounted to the stage 110 and is movable with the stage 110 and is configured to carry a wafer 200. For the sake of simplicity, the wafer 200 is not shown in FIG. 1. The probes 140 are disposed on the probe card 130 and the probe tips 141 of the probes 140 are configured to contact with the pads 210 disposed on the wafer 200 for electrical testing. For the sake of simplicity, the probe card 130 is not shown in FIG. 1. The first microscope 150 is movable relative to the stage 110. The first microscope 150 points towards a first direction D1, or downwards as shown in FIG. 2, and is configured to view an image along the first direction D1. In general, the probe card 130 is located between the first microscope 150 and the wafer 200. The second microscope 160 is connected with the chuck 120. The second microscope 160 points towards a second direction D2, or upwards as shown in FIG. 2, and is configured to view an image along the second direction D2. The second direction D2 is opposite to the first direction D1. When the chuck 120 moves with the stage 110, the second microscope 160 moves together with the chuck 120. The third microscope 170 is fixed relative to the stage 110. The third microscope 170 also points towards the first direction D1 and is configured to view an image along the first direction D1. For the sake of simplicity of the figures, other components of the wafer probe station 100 are not shown in FIGS. 1-2.

Figure 3:
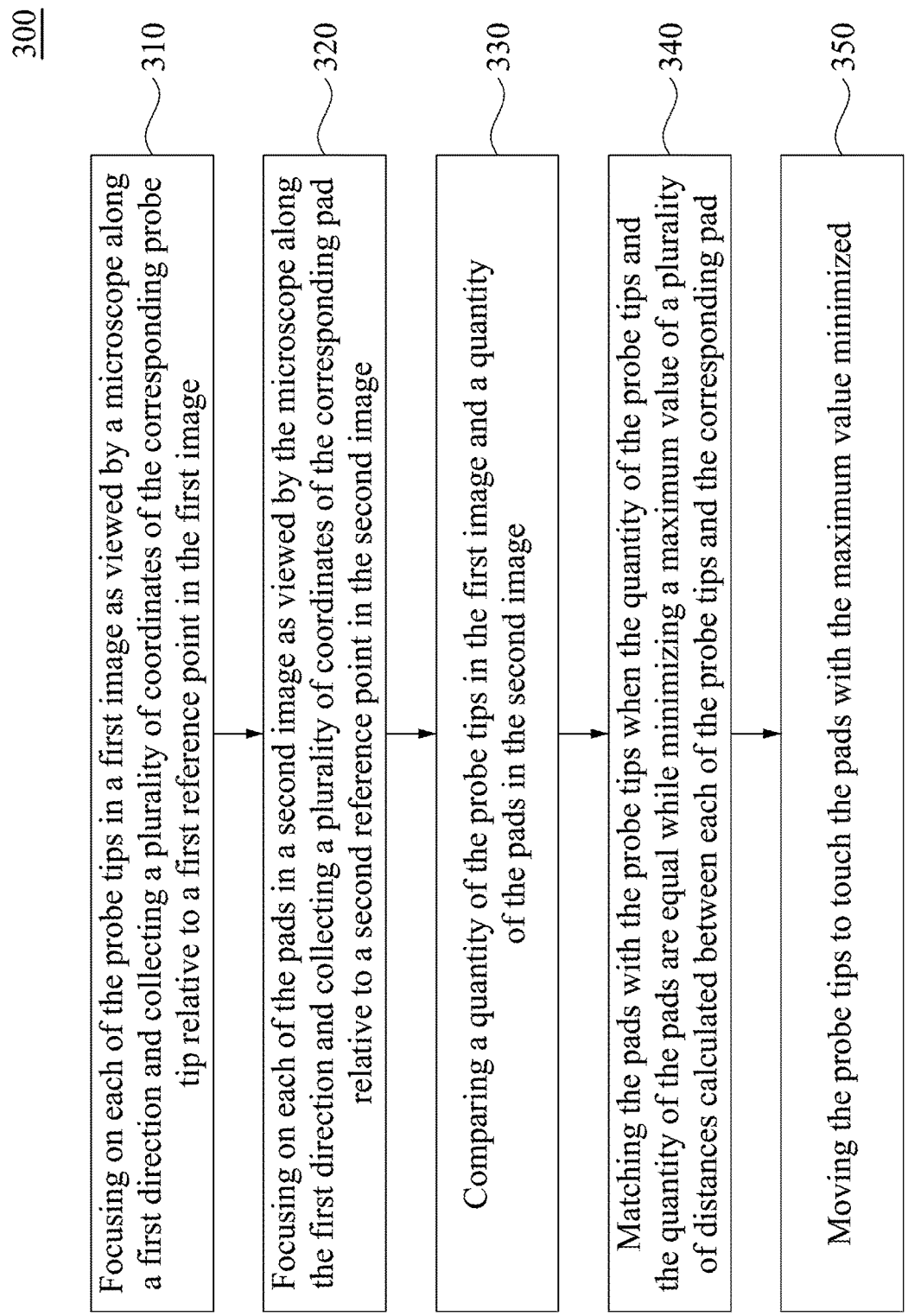
FIG. 3 is a flow diagram of a method of positioning a plurality of probe tips relative to a plurality of pads according to an embodiment of the present disclosure.
Figure 4:
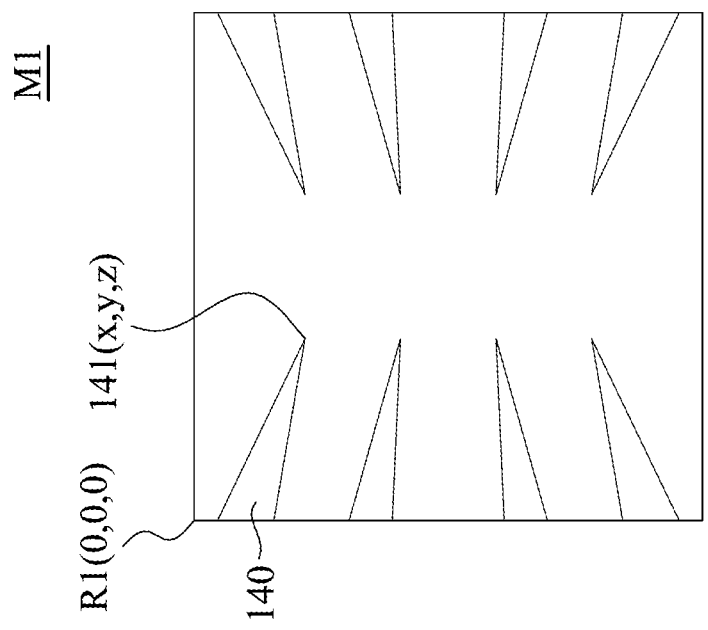
FIG. 4 is a graphic view of a first image as viewed by the first microscope.

Reference is made to FIG. 3. FIG. 3 is a flow diagram of a method 300 of positioning a plurality of probe tips 141 relative to a plurality of pads 210 according to an embodiment of the present disclosure. As shown in FIG. 3, in this embodiment, the positioning method 300 includes the following steps (it should be noted that the sequence of the steps and the sub-steps as mentioned below, unless otherwise specified, can all be adjusted upon the actual needs, or even executed at the same time or partially at the same time):

(1) Focusing on each of the probe tips 141 in a first image M1 as viewed by the first microscope 150 along the first direction D1 and collecting a plurality of coordinates of the corresponding probe tip 141 relative to a first reference point R1 in the first image M1 (Step 310). Reference is made to FIG. 4. FIG. 4 is a graphic view of the first image M1 as viewed by the first microscope 150. As shown in FIG. 4, for example, the left top corner is taken as the first reference point R1 in the first image M1. The probe tips 141 are focused by the first microscope 150 and the coordinates of the probe tips 141 sharply focused relative to the first reference point R1 are measured and collected. To be specific, the coordinates of the probe tips 141 are respectively three-dimensional coordinates, which include x-coordinate, y-coordinate and z-coordinate. For instance, the coordinates of the probe tip 141 as shown in FIG. 4 is in the form of (x, y, z) in the first image M1. Correspondingly, the coordinates of the first reference point R1 can be regarded as (0, 0, 0) in the first image M1.

To be specific, the value of z-coordinate of each of the probe tips 141 is obtained by a vertical movement of the first microscope 150 with a fixed magnification until a sharp image of the corresponding probe tip 141 is focused. The magnitude of the vertical movement defines the z-coordinate of the corresponding probe tip 141.

Figure 5:
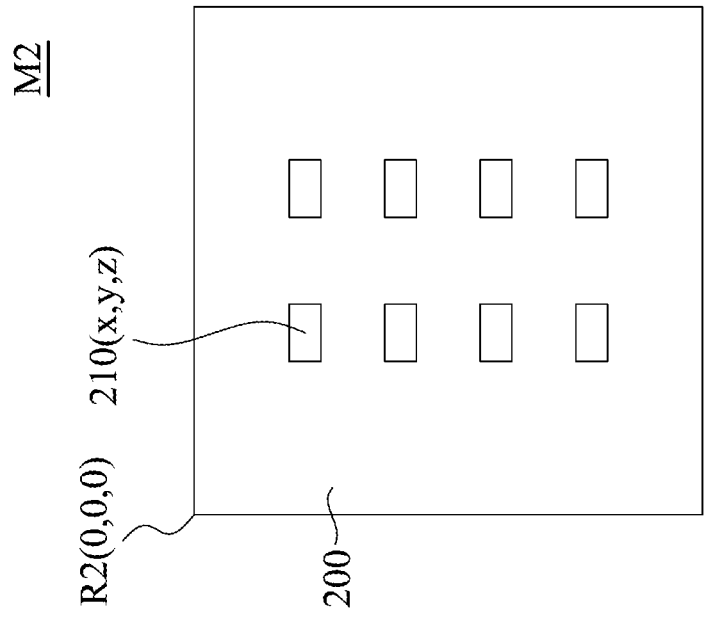
FIG. 5 is a graphic view of a second image as viewed by the second microscope.

(2) Focusing on each of the pads 210 in a second image M2 as viewed by the first microscope 150 along the first direction D1 and collecting a plurality of coordinates of the corresponding pad 210 relative to a second reference point R2 in the second image M2 (Step 320). Reference is made to FIG. 5. FIG. 5 is a graphic view of a second image M2 as viewed by the first microscope 150. As shown in FIG. 5, for example, the left top corner is taken as the second reference point R2 in the second image M2. The pads 210 are focused by the first microscope 150 and the coordinates of the pads 210 sharply focused relative to the second reference point R2 are measured and collected. To be specific, the coordinates of the pads 210 are respectively three-dimensional coordinates, which include x-coordinate, y-coordinate and z-coordinate. For instance, the coordinates of the pad 210 as shown in FIG. 5 is also in the form of (x, y, z) in the second image M2. In practice, the coordinates of the pad 210 can be taken as any particular point on the pad 210, such as the center. However, this does not intend to limit the present disclosure. Moreover, in this embodiment, each of the pads 210 shown in FIG. 5 is of a rectangular shape. In other embodiments, the pads 210 can be shaped as octagons or circles. Correspondingly, the coordinates of the second reference point R2 can be regarded as (0, 0, 0) in the second image M2.

It is worth to note that the probe card 130 has a through hole H in this embodiment as shown in FIG. 2. Therefore, the probe tips 141 and the pads 210 can be viewed by the first microscope 150 through the through hole H of the probe card 130 along the first direction D1.

Moreover, in this embodiment, a relative position of the second reference point R2 in the second image M2 to the first reference point R1 in the first image M1 is predetermined. In other words, the distance and orientation of the second reference point R2 relative to the first reference point R1 is known in advance. Thus, the distance and orientation of each of the probe tips 141 relative to the corresponding pad 210 can be accurately calculated.

(3) Comparing a quantity of the probe tips 141 in the first image M1 and a quantity of the pads 210 in the second image M2 (Step 330). For example, as shown in FIG. 4, the quantity of the probe tips 141 in the first image M1 is eight. On the other hand, as shown in FIG. 5, the quantity of the pad 210 in the second image M2 is also eight. In this case, the quantity of the probe tips 141 and the quantity of the pads 210 are equal. In practice, the quantity of the probe tips 141 and the quantity of the pads 210 can be compared by the number of sets of coordinates respectively collected from the first image M1 and the second image M2.

Figure 6:
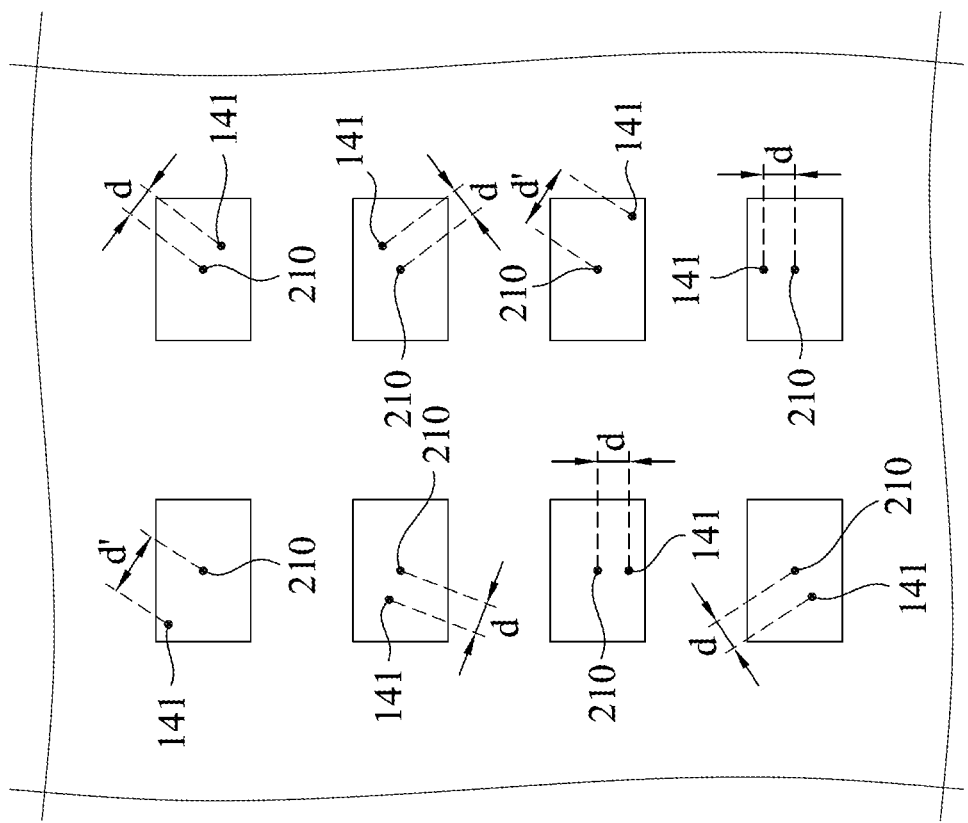
FIG. 6 is a top view of the pads of FIG. 2 as matched by the probe tips.

(4) Matching the pads 210 with the probe tips 141 when the quantity of the probe tips 141 and the quantity of the pads 210 are equal while minimizing a maximum value of a plurality of distances d calculated between each of the probe tips 141 and the corresponding pad 210 (Step 340). FIG. 6 is a top view of the pads 210 of FIG. 2 as matched by the probe tips 141. In practice, it may happen that at least one of the probe tips 141 being irregularly arranged with the other probe tips 141, due to prolonged use of the probes 140, for example. For the sake of simplicity, the probe tips 141 in FIG. 6 are presented in dots. Moreover, the markings of 210 in FIG. 6 represent the point of each of the pads 210 from which the coordinates of the corresponding pad 210 is measured and collected. In this embodiment, as shown in FIG. 6, the distances d between each of the pads 210 and the corresponding probe tip 141 to be matched are calculated using the coordinates of the pads 210 and the coordinates of the probe tips 141 collected.

It is worth to note that during the matching of the probe tips 141 to the pads 210, the distances d as calculated are analyzed such that the maximum value among the distances d calculated is minimized. In other words, each of the probe tips 141 is as close as possible to the desired contact point, such as the center point of each of the pads 210 as shown in FIG. 6, for example, of the corresponding pad 210, thus achieving the optimum arrangement of matching between all the probe tips 141 and the pads 210. In practice, at least two of the distances d reach the maximum value, which are presented as the two distances d' as shown in FIG. 6. Geometrically, the two distances d' are equal in magnitude but opposite in directions relative to the corresponding pads 210. In other embodiments, if there is no serious deformation of the probes 140 and thus the probe tips 141 are all regularly arranged, the distances d calculated can be all equal to zero, and thus the maximum value among the distances d can be equal to zero, too.

In practical applications, the step of matching the pads 210 with the probe tips 141 can be operated by a programmed procedure or a manual instruction, according to the actual situation, thus providing more flexibility for the user to operate the wafer probe station 100.

(5) Moving the probe tips 141 to touch the pads 210 with the maximum value minimized (Step 350). After the optimum arrangement of matching between all the probe tips 141 and the pads 210 is analyzed as mentioned above, the probe tips 141 are moved to touch the pads 210, with the maximum value among the distances d calculated being minimized, as shown in FIG. 6. This movement of the probe tips 141 to touch the pads 210 after the optimum arrangement of matching being analyzed can be controlled according to a programmed procedure or a manual instruction, depending on the situation.

(6) Assigning one of the pads 210 to match with the corresponding probe tip 141 when the quantity of the probe tips 141 and the quantity of the pads 210 are unequal while minimizing a maximum value of a plurality of distances d calculated between each of the probe tips 141 to be matched and the corresponding pad 210 to be matched (Step 360). In practical applications, there are occasions that the quantity of the probe tips 141 and the quantity of the pads 210 are unequal. For example, the quantity of the probe tips 141 is more than the quantity of the pads 210, or the quantity of the probe tips 141 is less than the quantity of the pads 210. When the quantity of the probe tips 141 and the quantity of the pads 210 are unequal, it will be the user who then assigns one of the pads 210 to match with the corresponding probe tip 141. Similarly, the analysis of the optimum arrangement of matching of the probe tips 141 to the pads 210, as mentioned above, is to be carried out. However, in this case, only the probe tips 141 to be matched and the pads 210 to be matched are taken into account in the analysis of the optimum arrangement of matching.

(7) Stopping matching the pads 210 with the probe tips 141 when the quantity of the probe tips 141 and the quantity of the pads 210 are unequal (Step 370). When the quantity of the probe tips 141 and the quantity of the pads 210 are unequal, as judged by the user according to the actual situation, the user can decide to stop matching the pads 210 with the probe tips 141 and not to move the probe tips 141 to touch the pads 210.

Figure 7:
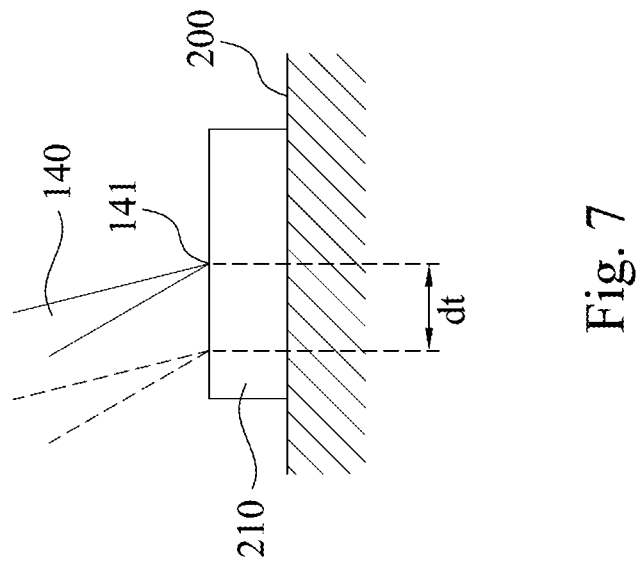
FIG. 7 is a magnified view of a probe tip being in touch with a pad after sliding on the pad by an overtravel distance.

(8) Offsetting the probe tips 141 by an overtravel distance dt before the probe tips 141 touching the pads 210 such that the minimized maximum value is maintained after the probe tips 141 touch the pads 210 by sliding the probe tips 141 on the pads 210 by the overtravel distance dt (Step 380). Reference is made to FIG. 7. FIG. 7 is a magnified view of a probe tip 141 being in touch with a pad 210 after sliding on the pad 210 by an overtravel distance dt. In some occasions, the probe tips 141 may be used to scrape the oxide layer formed on the surface of the pads 210. In other occasions, excessive force is exerted on the probe tips 141 for a better contact with the pads 210. In both cases, sliding of the probe tips 141 on the surface of the pads 210 by an overtravel distance dt happens. Therefore, according to the actual situation, as shown in FIG. 7, the probe tip 141, which is presented in hidden lines, is offset by the overtravel distance dt before the probe tip 141 touches the pad 210. In this way, the minimized maximum value among the distances d calculated, and thus the optimum arrangement of matching between all the probe tips 141 and the pads 210, can be maintained after sliding of the probe tip 141 on the pad 210 by the overtravel distance dt.

In a nutshell, the method 300 of positioning a plurality of probe tips 141 relative to a plurality of pads 210 allows a multiple of probe tips 141 to contact with a multiple of pads 210 conveniently and precisely, thus effectively enhancing the performance of the wafer probe station 100.

Figure 8:
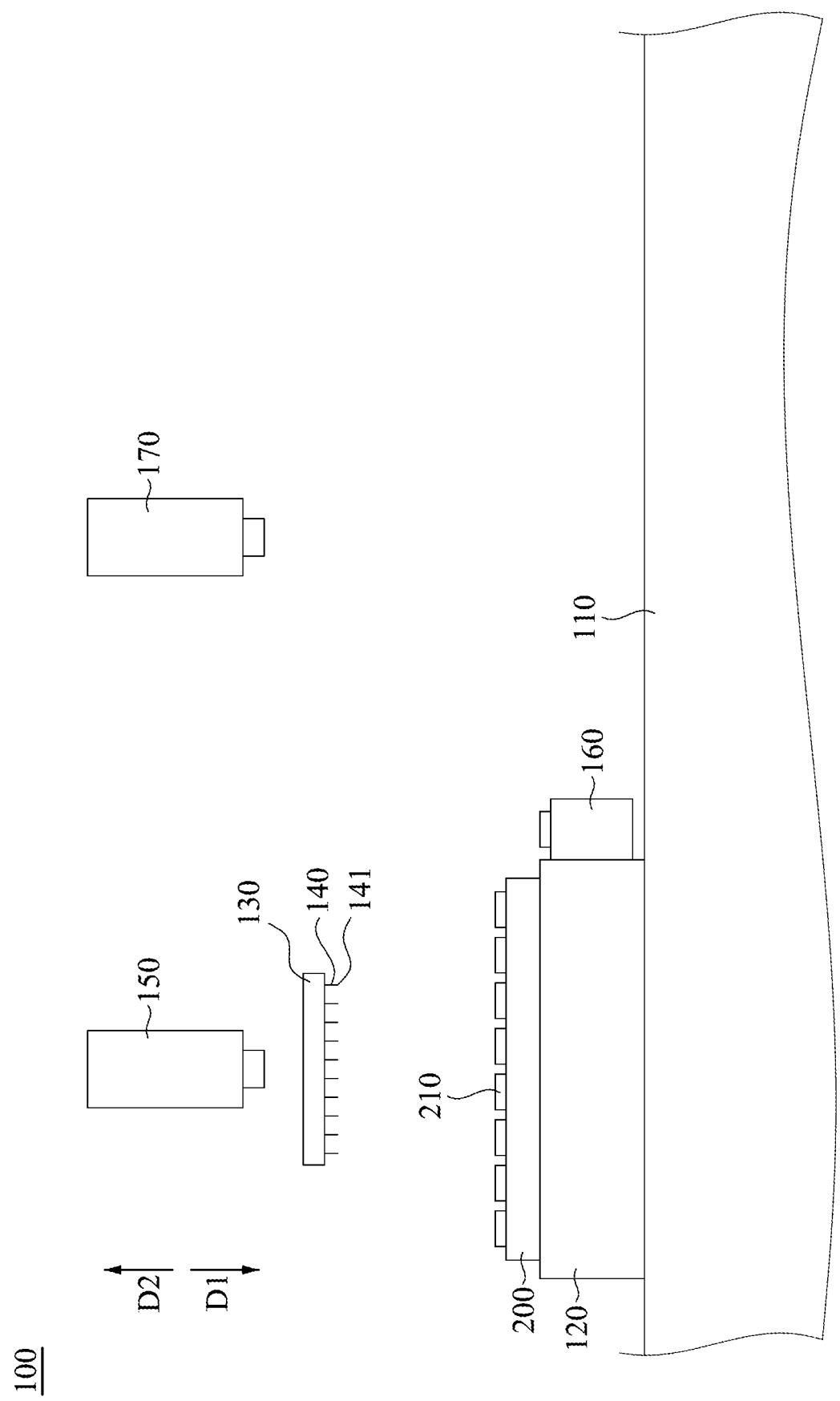
FIG. 8 is a front view of a wafer probe station according to another embodiment of the present disclosure, in which the probe card blocks the view of the probe tips from the first microscope.

Reference is made to FIG. 8. FIG. 8 is a front view of a wafer probe station 100 according to another embodiment of the present disclosure, in which the probe card 130 blocks the view of the probe tips 141 from the first microscope 150. In this embodiment, as shown in FIG. 8, the probe card 130 does not have a through hole similar to the through hole H as described in the previous embodiment above (referring to FIG. 2). Therefore, in this embodiment, the probe tips 141 located at the other side of the first microscope 150 cannot be viewed by the first microscope 150 along the first direction D1.

Figure 9:
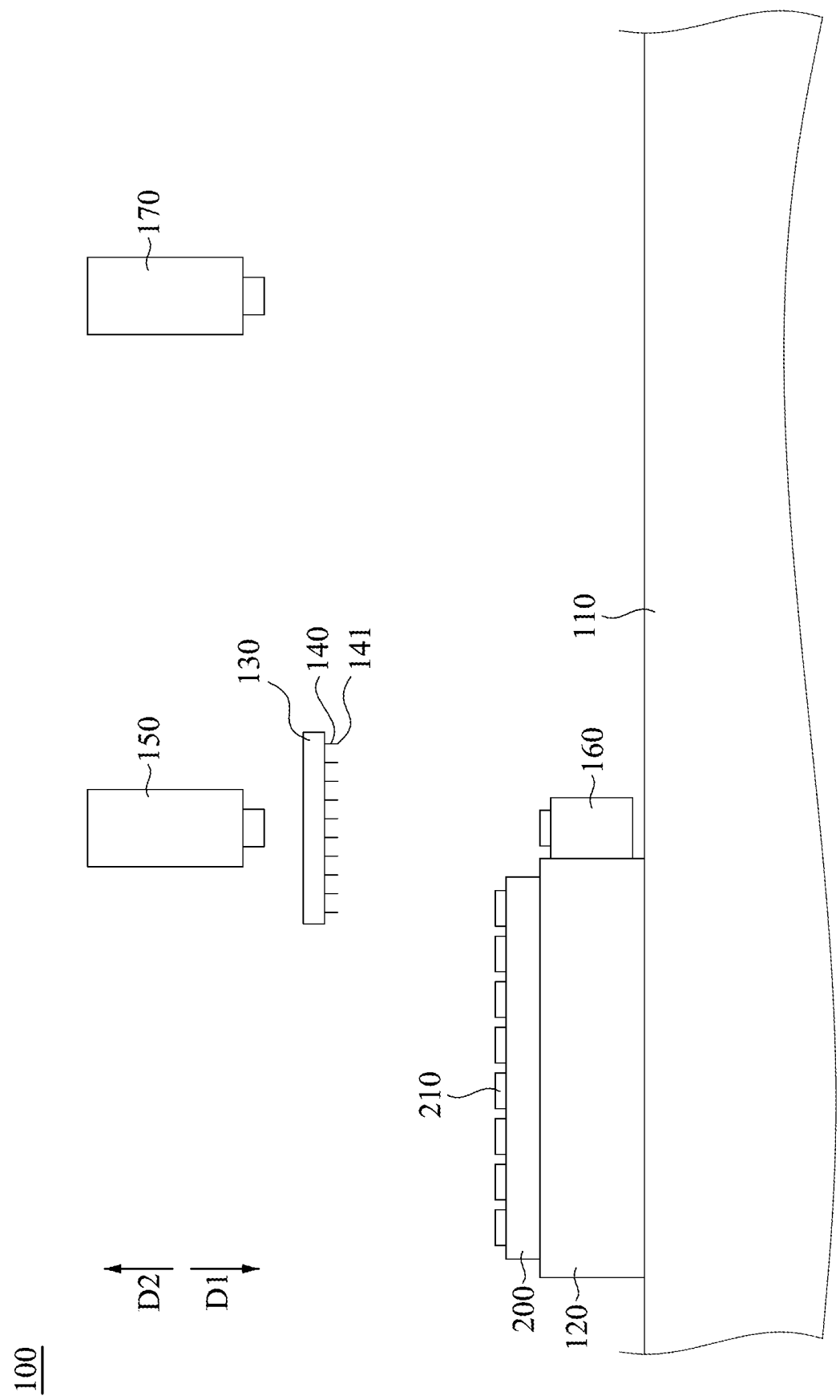
FIG. 9 is a front view of the wafer probe station of FIG. 8, in which the chuck is shifted such that the probe tips are viewed by the second microscope.

Reference is made to FIG. 9. FIG. 9 is a front view of the wafer probe station of FIG. 8, in which the chuck 120 is shifted such that the probe tips 141 are viewed by the second microscope 160. In this embodiment, as shown in FIG. 9, when the probe tips 141 located at the other side of the first microscope 150 cannot be viewed by the first microscope 150 through the probe card 130 along the first direction D1, the user can shift the chuck 120 with the stage 110 such that the second microscope 160 moves together with the chuck 120 and the probe tips 141 are viewed by the second microscope 160. The image viewed by the second microscope 160 is regarded as the first image M1 then, as presented in FIG. 4. Similarly, the probe tips 141 are focused by the second microscope 160 and the coordinates of the probe tips 141 sharply focused relative to the first reference point R1 in the first image M1 are measured and collected.

To increase the flexibility of the application of the wafer probe station 100, even if the probe card 130 has the through hole H as described in the previous embodiment above (referring to FIG. 2), the user can still shift the chuck 120 with the stage 110 such that the second microscope 160 moves together with the chuck 120 and the probe tips 141 are viewed by the second microscope 160.

Figure 10:
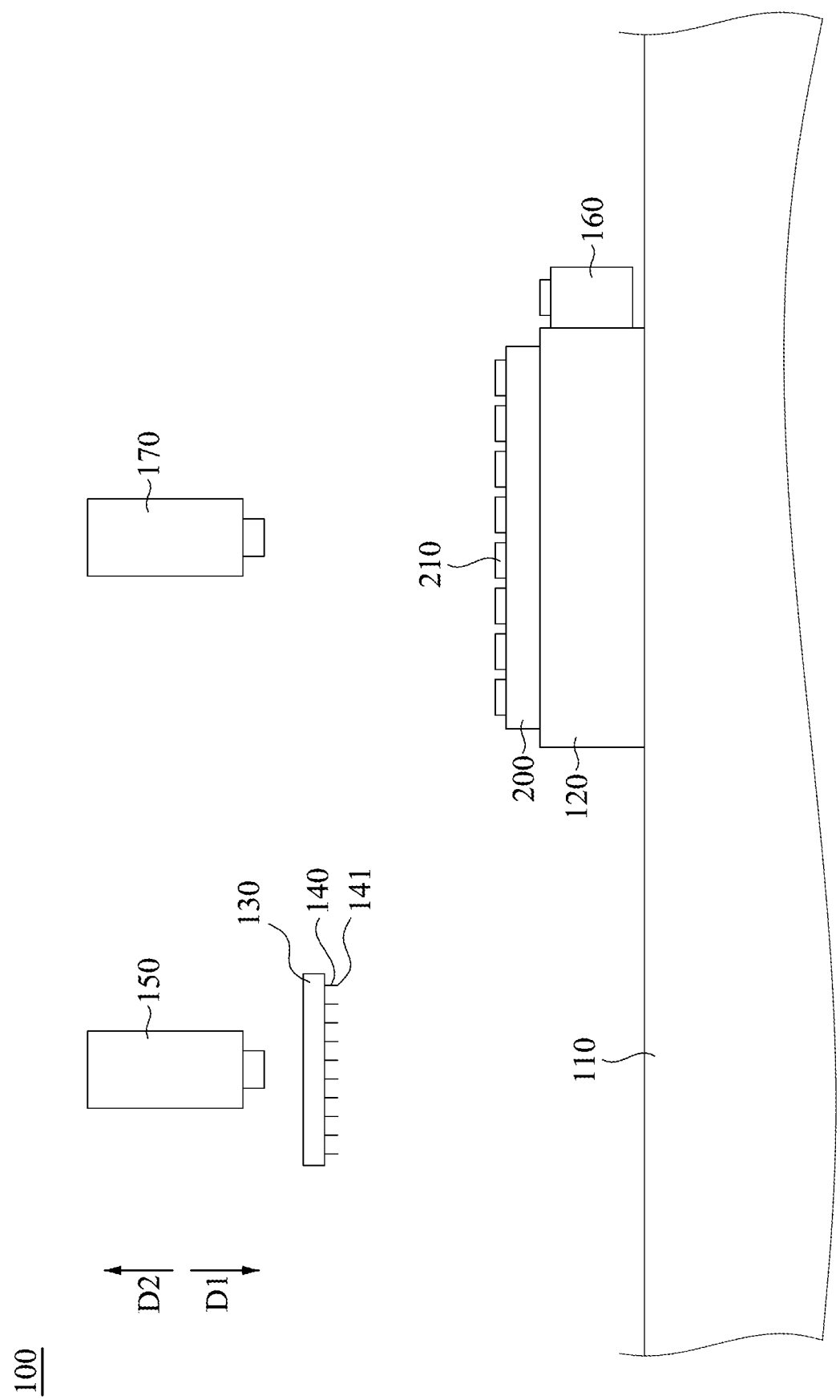
FIG. 10 is a front view of the wafer probe station of FIG. 8, in which the chuck is shifted such that the pads are viewed by the third microscope.

Reference is made to FIG. 10. FIG. 10 is a front view of the wafer probe station of FIG. 8, in which the chuck 120 is shifted such that the pads 210 are viewed by the third microscope 170. In this embodiment, as shown in FIG. 10, when the probe card 130 without a through hole is located at the middle between the first microscope 150 and the pads 210 such that the pads 210 cannot be viewed by the first microscope 150 through the probe card 130 along the first direction D1, the user can shift the chuck 120 with the stage 110 such that the pads 210 are viewed by the third microscope 170. The image viewed by the third microscope 170 is regarded as the second image M2 then, as presented in FIG. 5. Similarly, the pads 210 are focused by the third microscope 170 and the coordinates of the pads 210 sharply focused relative to the second reference point R2 in the second image M2 are measured and collected.

Figure 11:
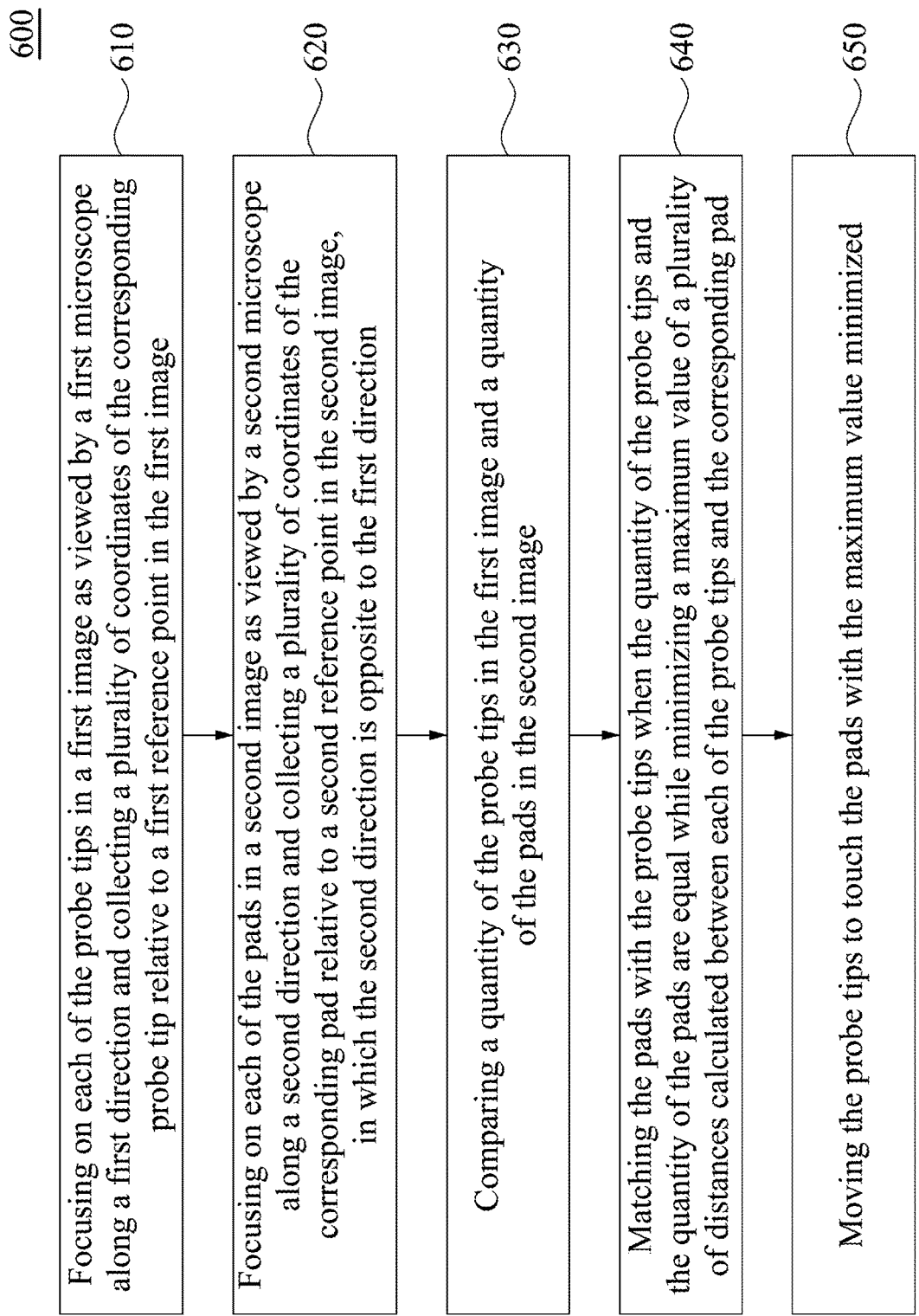
FIG. 11 is a flow diagram of a method of positioning a plurality of probe tips relative to a plurality of pads according to another embodiment of the present disclosure.

Reference is made to FIG. 11. FIG. 11 is a flow diagram of a method 600 of positioning a plurality of probe tips 141 relative to a plurality of pads 210 according to another embodiment of the present disclosure. As shown in FIG. 11, with regard to the embodiment described above that the probe tips 141 and the pads 210 cannot be viewed by the first microscope 150 through the probe card 130 along the first direction D1, a method 600 of positioning a plurality of probe tips 141 relative to a plurality of pads 210 disposed on a movable chuck 120 is provided. The positioning method 600 in this embodiment includes the following steps (it should be noted that the sequence of the steps and the sub-steps as mentioned below, unless otherwise specified, can all be adjusted upon the actual needs, or even executed at the same time or partially at the same time):

(1) Focusing on each of the probe tips 141 in a first image M1 as viewed by the second microscope 160 along the second direction D2 and collecting a plurality of coordinates of the corresponding probe tip 141 relative to a first reference point R1 in the first image M1 (Step 610).

(2) Focusing on each of the pads 210 in a second image M2 as viewed by the third microscope 170 along the first direction D1 and collecting a plurality of coordinates of the corresponding pad 210 relative to a second reference point R2 in the second image M2 (Step 620). The second direction D2 is opposite to the first direction D1. Moreover, a relative position of the second reference point R2 in the second image M2 to the first reference point R1 in the first image M1 is predetermined.

(3) Comparing a quantity of the probe tips 141 in the first image M1 and a quantity of the pads 210 in the second image M2 (Step 630).

(4) Matching the pads 210 with the probe tips 141 when the quantity of the probe tips 141 and the quantity of the pads 210 are equal while minimizing the maximum value of a plurality of distances d calculated between each of the probe tips 141 and the corresponding pad 210 (Step 640).

(5) Moving the probe tips 141 to touch the pads 210 with the maximum value minimized (Step 650).

Figure 12:
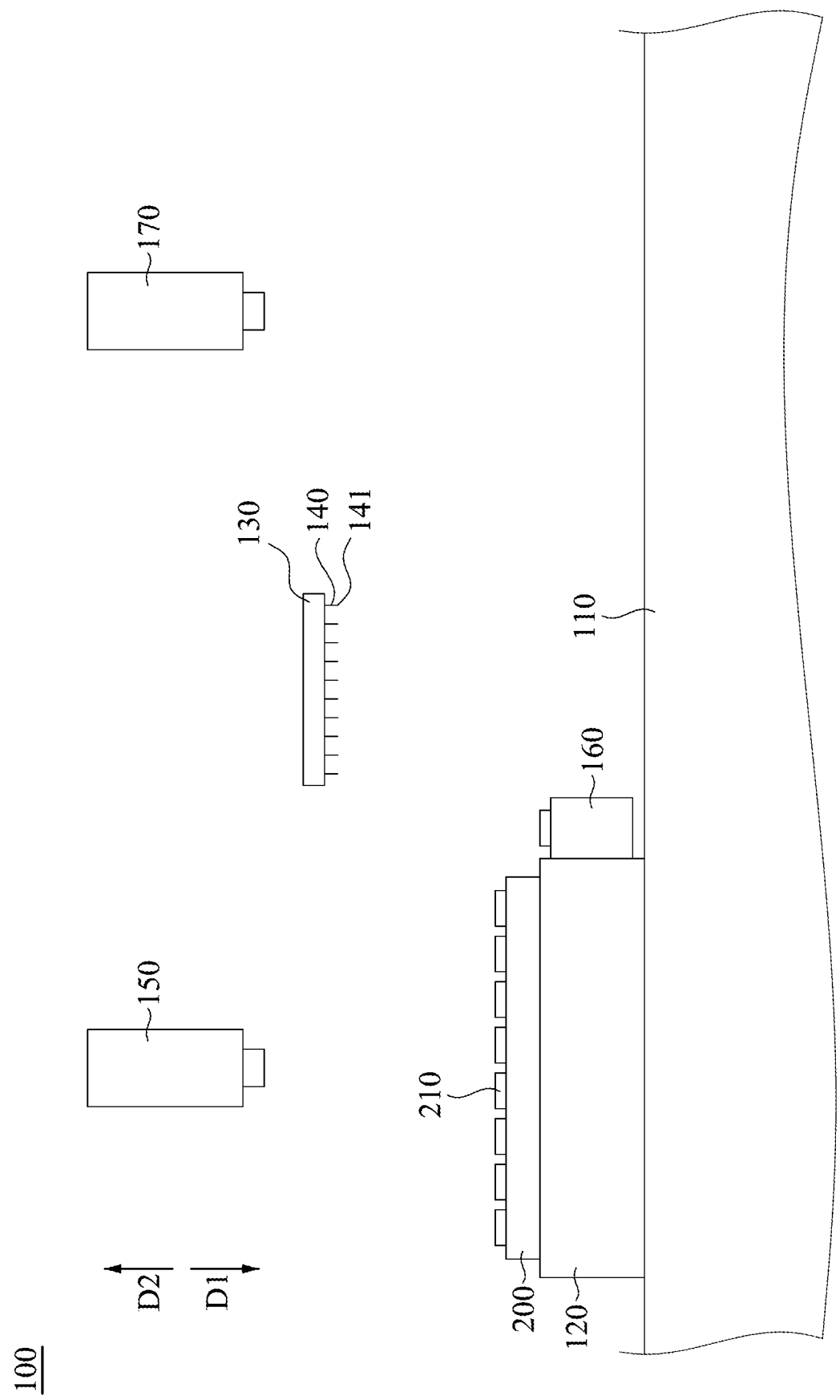
FIG. 12 is a front view of the wafer probe station of FIG. 8, in which the chuck and the first microscope are shifted away from the probe card such that the pads are viewed by the first microscope.

Reference is made to FIG. 12. FIG. 12 is a front view of the wafer probe station 100 of FIG. 8, in which the chuck 120 and the first microscope 150 are shifted away from the probe card 130 such that the pads 210 are viewed by the first microscope 150. In this embodiment, as shown in FIG. 12, when the probe card 130 without a through hole is located at the middle between the first microscope 150 and the pads 210 such that the pads 210 cannot be viewed by the first microscope 150 through the probe card 130 along the first direction D1, apart from shifting the chuck 120 with the stage 110 such that the pads 210 are viewed by the third microscope 170, according to the actual situation, the user can choose to shift the chuck 120 and the first microscope 150 together away from the probe card 130 such that the pads 210 are viewed by the first microscope 150.

In conclusion, when compared with the prior art, the aforementioned embodiments of the present disclosure have at least the following advantage: the method of positioning a plurality of probe tips relative to a plurality of pads allows a multiple of probe tips to contact with a multiple of pads conveniently and precisely, thus effectively enhancing the performance of the wafer probe station.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A method of positioning a plurality of probe tips relative to a plurality of pads, comprising:
    focusing on each of the probe tips in a first image as viewed by a microscope along a direction and collecting a plurality of coordinates of the corresponding probe tip relative to a first reference point in the first image;
    focusing on each of the pads in a second image as viewed by the microscope along a direction and collecting a plurality of coordinates of the corresponding pad relative to a second reference point in the second image, a relative position of the second reference point to the first reference point being predetermined;
    comparing a quantity of the probe tips in the first image and a quantity of the pads in the second image;
    matching the pads with the probe tips when the quantity of the probe tips and the quantity of the pads are equal while minimizing a first maximum value of a plurality of first distances calculated between each of the probe tips and the corresponding pad; and
    moving the probe tips to touch the pads with the first maximum value minimized.

2. The positioning method of claim 1, further comprising:
    assigning one of the pads to match with the corresponding probe tip when the quantity of the probe tips and the quantity of the pads are unequal while minimizing a second maximum value of a plurality of second distances calculated between each of the probe tips to be matched and the corresponding pad to be matched.

3. The positioning method of claim 1, further comprising:
    stopping matching the pads with the probe tips when the quantity of the probe tips and the quantity of the pads are unequal.

4. The positioning method of claim 1, further comprising:
    offsetting the probe tips by an overtravel distance before the probe tips touching the pads such that the minimized first maximum value is maintained after the probe tips touch the pads by sliding the probe tips on the pads by the overtravel distance.

5. The positioning method of claim 1, wherein matching the pads with the probe tips comprises:
    manually instructing to match the pads with the probe tips.

6. The positioning method of claim 1, wherein the coordinates of the probe tips and the coordinates of the pads are respectively three-dimensional coordinates.

7. A method of positioning a plurality of probe tips relative to a plurality of pads disposed on a chuck, comprising:
    focusing on each of the probe tips in a first image as viewed by a first microscope along a first direction and collecting a plurality of coordinates of the corresponding probe tip relative to a first reference point in the first image;
    focusing on each of the pads in a second image as viewed by a second microscope along a second direction and collecting a plurality of coordinates of the corresponding pad relative to a second reference point in the second image, the second direction being opposite to the first direction, a relative position of the second reference point to the first reference point being predetermined;
    comparing a quantity of the probe tips in the first image and a quantity of the pads in the second image;
    matching the pads with the probe tips when the quantity of the probe tips and the quantity of the pads are equal while minimizing a first maximum value of a plurality of first distances calculated between each of the probe tips and the corresponding pad; and
    moving the probe tips to touch the pads with the first maximum value minimized.

8. The positioning method of claim 7, wherein the first microscope is connected with the chuck.

9. The positioning method of claim 7, wherein being viewed by the second microscope comprises:
    moving the chuck relative to the second microscope such that the pads disposed on the chuck are viewed by the second microscope.

10. The positioning method of claim 7, wherein being viewed by the second microscope comprises:
    moving the chuck together with the second microscope relative to the probe tips such that the pads disposed on the chuck are viewed by the second microscope.

11. The positioning method of claim 7, further comprising:
    assigning one of the pads to match with the corresponding probe tip when the quantity of the probe tips and the quantity of the pads are unequal while minimizing a second maximum value of a plurality of second distances calculated between each of the probe tips to be matched and the corresponding pad to be matched.

12. The positioning method of claim 7, further comprising:
    stopping matching the pads with the probe tips when the quantity of the probe tips and the quantity of the pads are unequal.

13. The positioning method of claim 7, further comprising:
    offsetting the probe tips by an overtravel distance before the probe tips touching the pads such that the minimized first maximum value is maintained after the probe tips touch the pads by sliding the probe tips on the pads by the overtravel distance.

14. The positioning method of claim 7, wherein matching the pads with the probe tips comprises:
    manually instructing to match the pads with the probe tips.

15. The positioning method of claim 7, wherein the coordinates of the probe tips and the coordinates of the pads are respectively three-dimensional coordinates.

* * * * *